United States Patent
Dahan et al.

(10) Patent No.: US 8,558,589 B2
(45) Date of Patent: Oct. 15, 2013

(54) FULLY DIGITAL METHOD FOR GENERATING SUB CLOCK DIVISION AND CLOCK WAVES

(75) Inventors: Nir Dahan, Munich (DE); Kevin Graham Allen, Chepstow (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 43 days.

(21) Appl. No.: 13/402,264

(22) Filed: Feb. 22, 2012

(65) Prior Publication Data

US 2013/0214826 A1  Aug. 22, 2013

(30) Foreign Application Priority Data

Feb. 20, 2012  (EP) ..................................... 12392001

(51) Int. Cl.
*H03B 19/00* (2006.01)
(52) U.S. Cl.
USPC ........... 327/115; 327/117; 327/291; 327/298; 377/48
(58) Field of Classification Search
None
See application file for complete search history.

(56) References Cited

U.S. PATENT DOCUMENTS

| 4,866,741 | A | 9/1989 | Minuhin | |
|---|---|---|---|---|
| 5,552,732 | A | 9/1996 | Huang | |
| 6,861,881 | B1 | 3/2005 | Neravetla et al. | |
| 6,864,735 | B2 * | 3/2005 | Joo | 327/298 |
| 7,342,425 | B1 * | 3/2008 | Kang | 327/115 |
| 7,667,517 | B2 | 2/2010 | Iler | |
| 7,801,263 | B2 | 9/2010 | Haimzon | |
| 2004/0012423 | A1 | 1/2004 | Maeda | |
| 2004/0179641 | A1 | 9/2004 | Mack et al. | |
| 2011/0234265 | A1 | 9/2011 | Huang | |

OTHER PUBLICATIONS

European Search Report, 12392001.9-2215, Mail date—Aug. 2, 2012, Dialog Semiconductor GmbH.

* cited by examiner

*Primary Examiner* — An Luu
(74) *Attorney, Agent, or Firm* — Saile Ackerman LLC; Stephen B. Ackerman

(57) ABSTRACT

The present disclosure provides circuitry and a method for digital clock generation including the generation of integer and non-integer sub clocks. The proposed method provides simplified constant signal propagation and low skew in the divided clock path independent of division factor. Also provided is a simplified mechanism for generating low power clock patterns divided down by factors which are non-integer, phase-shifted, repeated pulse trains, dynamically changing and glitch-free.

22 Claims, 6 Drawing Sheets

FULLY DIGITAL METHOD FOR GENERATING SUB CLOCK DIVISION AND CLOCK WAVES

BACKGROUND

1. Technical Field

This present disclosure relates to circuitry and methods for clock generation. More particularly, the present disclosure relates to fully digital circuits and methods for generating sub clock divisions and clock waves with low skew and simplified implementation.

2. Background Art

Clock generation is very important to efficient low power designs. Most clock generation systems are built in a manner which introduces skew, using complicated selection mechanisms or a cascade of flip flops which generate low order divided clocks. Several pertinent clock generation prior art documents are listed below.

U.S. Pat. No. 5,552,732—"High speed divide by 1.5 clock generator" uses a divide by 3 circuit with 3 gates.

US Patent Application US2011/0234265—"Programmable frequency divider" demonstrates a divide by programmable integer factors.

U.S. Pat. No. 4,866,741—"3/2 frequency divider" employs two D-type flip-flops, an OR gate and an AND gate.

U.S. Pat. No. 7,801,263—"Clock divider with a rational division factor" (Haimzon) provides methods, apparatus, and systems for dividing an input clock or master clock by an integer or non-integer divisor and generating one or more balanced, e.g., 50% duty cycle, divided that are phase-aligned to the input clock.

U.S. Pat. No. 7,667,517—"System and method for fully digital clock divider with non-integer divisor support" provides a system and method that use a first clock to digitally generate a second clock, wherein the ratio of the frequency of the first clock to the frequency of the second clock is a non-integer.

BRIEF SUMMARY

It is the objective of the present disclosure to provide circuitry and a method for digital clock generation including the generation of integer and non-integer sub clocks.

The objects of the present disclosure are achieved by a combined positive and negative clock gate, a clock output generated by said combined positive and negative clock gate, a clock input coupled to a counter circuit and to said combined positive and negative clock gate. The present disclosure contains a positive comparator, a negative comparator, an output from the counter circuit coupled to the positive comparator and to the negative comparator, an enable positive clock signal in the combined positive and negative clock gate generated from an output from the positive comparator, and an enable negative clock signal in the combined positive and negative clock gate generated from an output the negative comparator.

DETAILED DESCRIPTION

Figure 1:
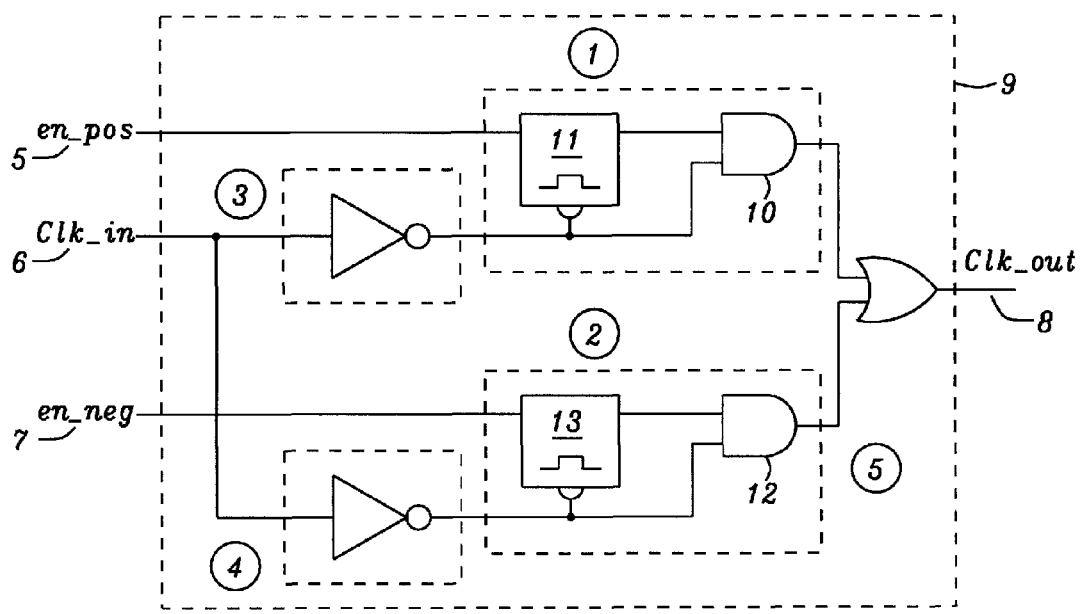
FIG. 1 shows main embodiment of the present disclosure which is a combined positive/negative clock gate.

FIG. 1 shows a basic building block, a combined positive/negative clock gate. This circuit 9 enables a low skew, highly flexible clock division scheme. The circuit 9 contains a clock gate 1 which contains an AND gate 10 and a transparent low latch 11. A clk_in signal 6 is buffered 3 and couples to one input of the AND gate 10. An en_pos signal couples to block 11 to enable the positive clk_in clock 6. Similarly, circuit 9 contains a clock gate 2 which contains an AND gate 12 and a transparent low latch 13. A clk_in signal 6 is inverted 4 and couples to one input of the AND gate 12. An en_neg signal couples to block 13 to enable the inverse of the clk_in clock 6 which is the output of inverter 4. The outputs of AND gate 10 and AND gate 12 feed OR gate block 5 which is the "combine clocks OR gate." The OR gate output, clk_out is the desired divided down low-skew clock. In practice, the circuit works on the principle of combining edge selected clocks from a higher order frequency clock or its inverted version. Selected edges are then "combined" using an OR gate to generate the desired frequency at the output. The single clock gate scheme of block 9 in FIG. 1 can provide integer clock division factors. i.e. divide by 2, 3, 4, . . . , but also can provide clock division by 1.5, 2.5, 3.5 . . . etc. Until now, common practice was to use only transparent low latch and AND gate structures, which allow only integer division. The combined structure shown in block 9 of FIG. 1 enables both integer and non-integer clock division. This building block 9 is compatible with mainstream Electronic Design Automation (EDA) tools in synchronous digital design flows.

Figure 2:
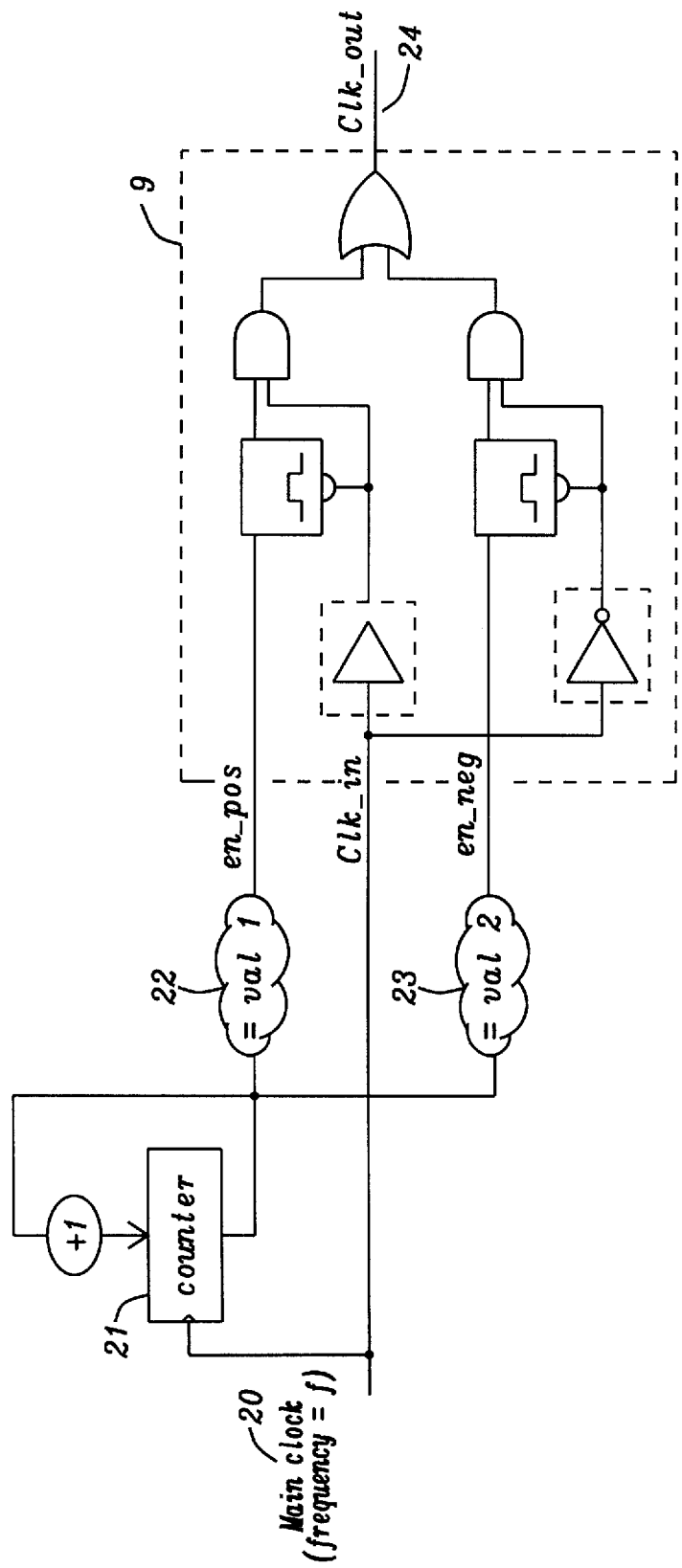
FIG. 2 is a general purpose circuit for clock division.
Figure 6:
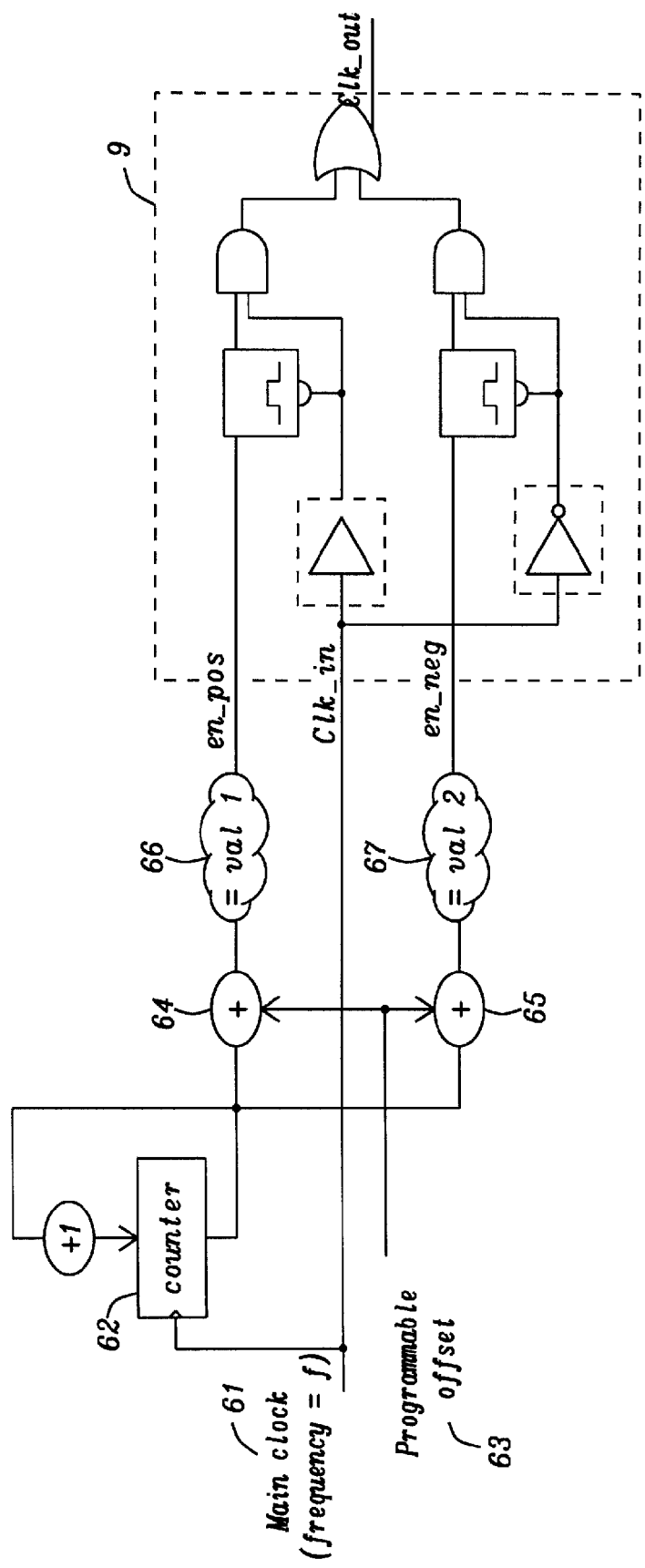
FIG. 6 shows an example of clock division with programmable offset.

FIG. 2 illustrates a general-purpose circuit for clock division. FIG. 2 shows how the en_pos and en_neg signals shown in FIG. 1 are generated and implemented in circuitry. FIG. 2 circuit shows the overall general circuit of the present disclosure where integer factors are possible as well as division factors exactly in between two integers. i.e. 2.5, 3.5, 4.5, . . . . The basic circuit building block 9 from FIG. 1 is used. A main input clock 20 with frequency, f, couples to a counter 21. This main clock 20 also couples to the clk_in input of the basic building block circuit 9. The output of the counter 21 couples to two digital comparator circuits 22, 23. The output of comparator 22 couples to the en_pos signal and the output of comparator 23 couples to the en_neg signal. The values (ie. val 1 in 22 and val 2 in 23) are either predetermined for generation of fixed ratio-clocks or calculated "on the fly" for generation of more complicated clock signals. The predetermined values are fixed during operation and result in a fixed division 1.5, 2, 2.5, 3, 3.5, . . . etc. The 'on the fly' values allow the division factor to change. This means that some circuitry like a state machine or even a simple adder calculates the new values to compare to and thus allow much more complex clock waveforms to be generated. An example for this is seen in FIG. 6 where an adder is combined with a counter and a predetermined value in order to generate a complex clock. These values are decided depending on the division factor needed. Typically, one of the comparators will compare to the last or largest value of the counter. For integer counter division, only either the en_pos signal or the en_neg signal is active, while the other is held to zero to produce a zero at the input of the OR gate 5 in FIG. 1.

Figure 3:
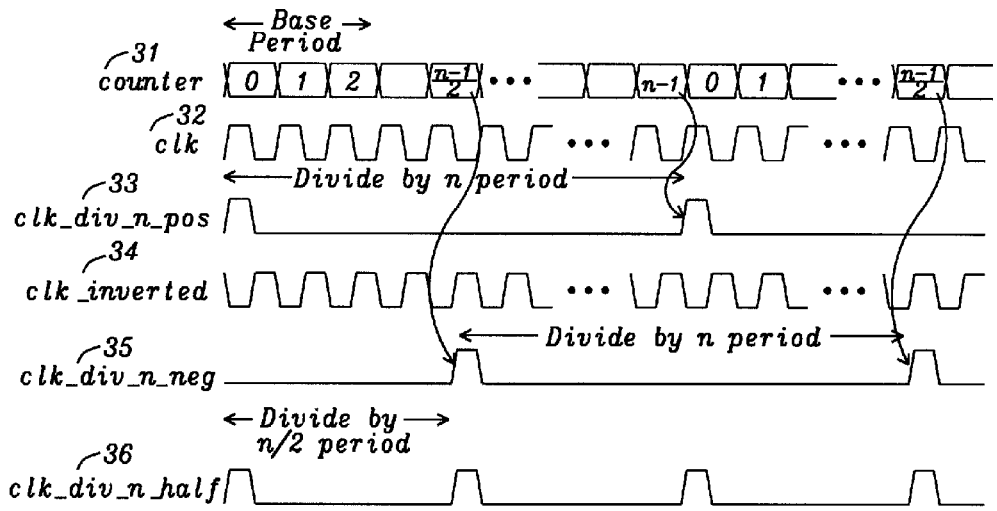
FIG. 3 shows a scheme for generation of divide by n/2 clock from a base frequency.

FIG. 3 shows a typical "divide by non-integer" scheme, that is only possible with the new structure of FIG. 2 and not with the single clock gate structure of the prior art. FIG. 3 shows the generation of the two signals clk_div_n_pos and clk_div_n_neg which are the output of the 'positive clock gate' and the 'negative clock gate' respectively. Each in turn has a period of a 'divide by n'—where n is an odd integer. The positive clock gate 'selects' each n-th clock edge which coincides with the counter value 'n−1'. The negative clock gate 'selects' each n-th inverted clock edge coinciding with the value '(n−1)/2'. The two edges are non-overlapping in time and are then 'combined' with the OR gate at the output. The resulting frequency is a 'divide by n/2' from the original clk.

Figure 4:
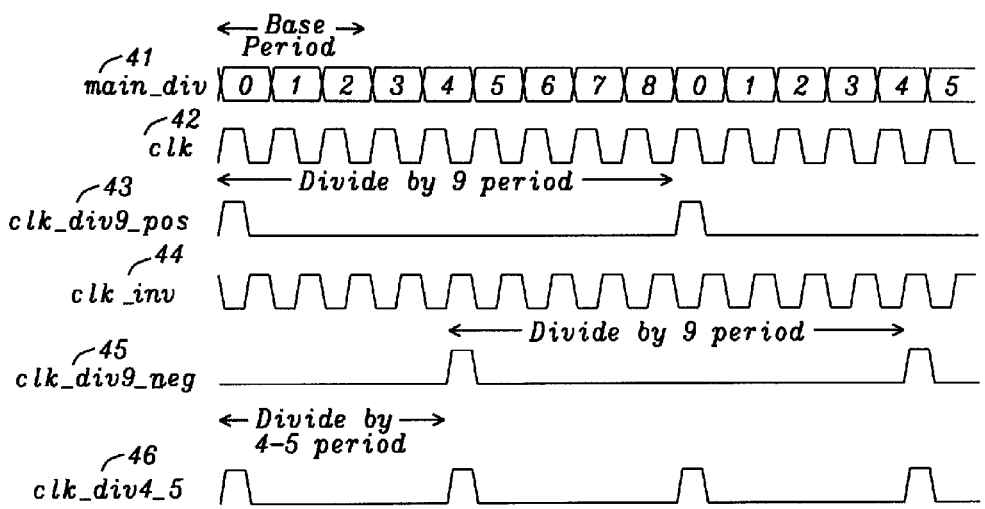
FIG. 4 shows an example of a divide by 4.5 clock from a base frequency.

FIG. 4 shows an exact waveform diagram for a divide by 4.5 circuit as an example. It is important to note that the above generation can be shifted in time (or phase) by modifying the values (22, 23 in FIG. 2) enabling the positive and negative clock gates.

Figure 5:
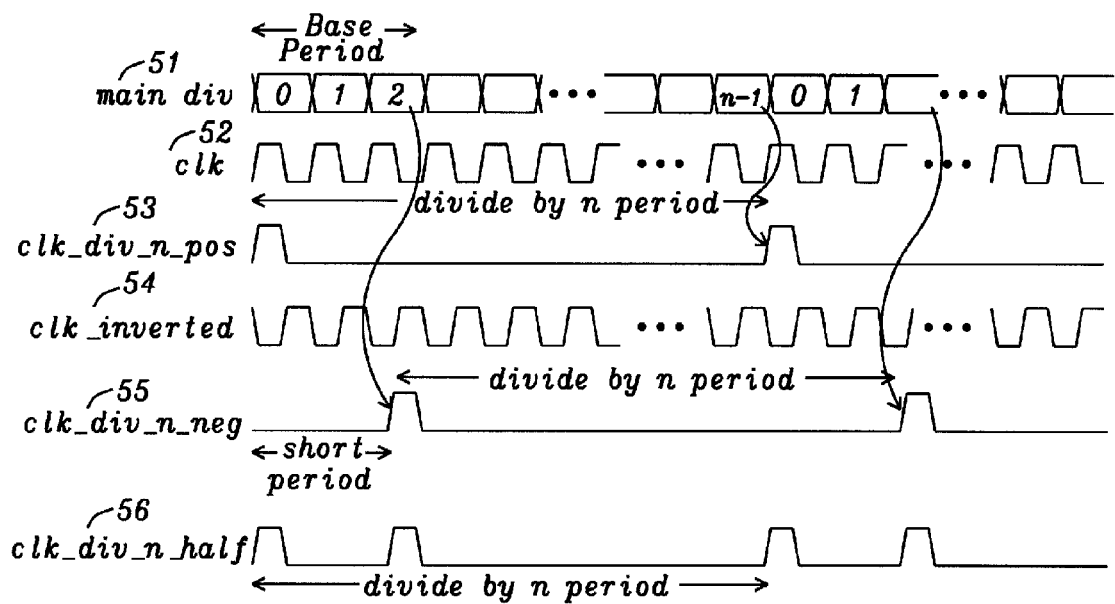
FIG. 5 shows a general scheme for generation of a "dual clock pulse" with a period of "divide by n".

The proposed method can also be used to create repeated pulses by modifying the compare values for the en_pos and en_neg inputs of the 'combined clock gate'. FIG. 5 shows a generation of a 'double pulse' repeated each n cycles. The proposed circuits enable simple control over the distance between the two (or more) pulses, referred to in the diagram as 'short period' and the overall cycle time, referred to as 'divide by n' period as depicted. By generating different patterns that enable the 'positive clock gate' or the negative clock gate', a complex pattern of 'selected edges' can be created by the proposed circuit. Again, this is accomplished by modifying the values (22, 23 in FIG. 2) enabling the positive and negative clock gates.

Figure 7:
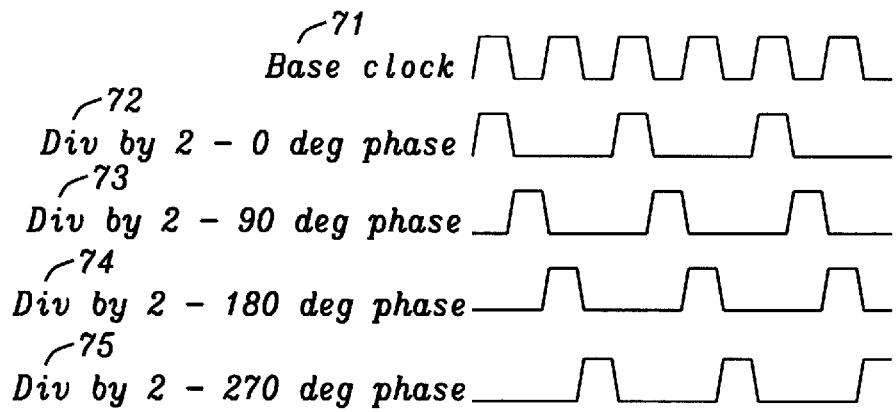
FIG. 7 shows the generation of multiple phases of a "Divide by 2" clock from a given base frequency.

The proposed method also enables the generation of divided down clocks shifted in time. To achieve a phase shift in time, the modified circuit from FIG. 2 is used, as shown in FIG. 6. A phase shifted 'divide by . . . ' circuit is principally identical to a normal 'divide by . . . ' circuit. The slight difference is that the comparison values depicted in FIG. 2 (val 1 and val 2—22,23 respectively) are modified. An example would be the circuit for exact division by 4.5 depicted in FIG. 4. If we make val 1=0 and val 2=5 (from FIG. 2) the result would be the exact division factor of 4.5 but the generated clock waveform would be 'pushed' forward in time and will not be aligned to the original divide by 4.5 clock depicted in FIG. 4. FIG. 7 shows some possibilities. The basic concept is to keep the same counter for a non-phase-shifted divider, just change the comparison values (val 1 and val2). Effectively keeping their "distance in time" from one another fixed, will generate the same divide-by-factor but will shift them in phase/time.

Figure 8:
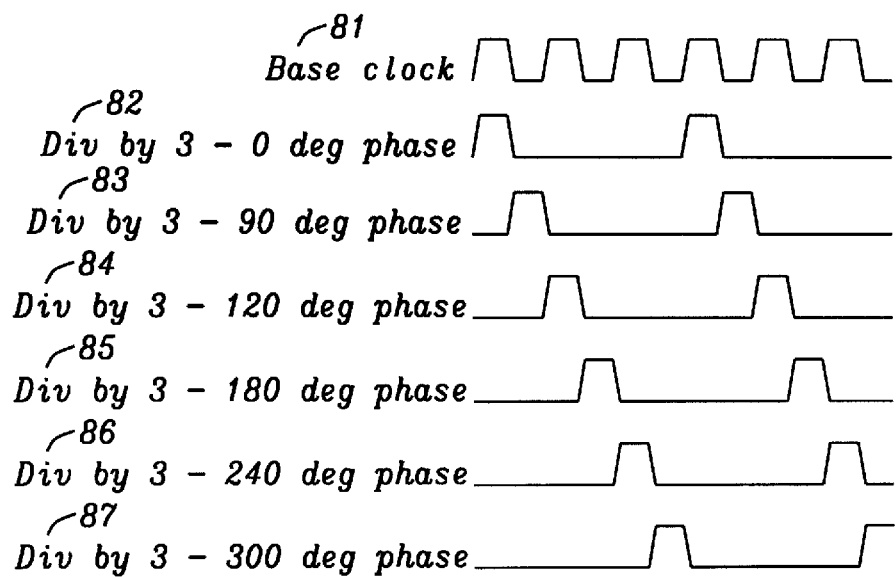
FIG. 8 shows the generation of multiple phases of a "Divide by 3" clock from a given base frequency.

The phase shift limits depend on the divide-by-factor. And the number of possibilities are twice the divide-by-factor. E.g. FIG. 7 depicts a divide by 2 factor, hence there are 4 possibilities (2*2) to generate a divide-by-2 clock from the base clock. FIG. 8 has a divide-by-3 circuit and hence the circuitry described can generate 6 possible (2*3) phase offset clocks. By adding an offset to the compared value of FIG. 2, the generated effect is of 'pushing' the clock generated in time and aligning it to the consecutive phases of the main clock. In general, the phase shifts can be calculated as follows. (180/division factor)*N—where N goes from 0 to (2*division factor)−1. E.g for a divide by 2, the possible phases are therefore 180/2=90 times 0, 1, 2, 3—or in other words, 0, 90, 180, 270. E.g., for a divide by 6 the possible phases are 180/3=60 times 0, 1, 2, 3, 4, 5 etc. The examples are shown in FIGS. 7 and 8.

The key advantage of this clock generation disclosure are as follows. The key mechanism is digital frequency division through clock edge selection. Other attributes are clock subdivision for both integer and non-integer factors. Also provided is a mechanism for the generation of a single or a series of clock pulses in a periodic fashion. Also provided are phase shifted versions of all of the integer and non-integer subdivided clocks provided. The clock generation methodology is simple, scalable, and glitch-free providing constant delay and low skew. Also, the clock generation requirements can be modified "on the fly" by dynamically changing the values in the positive and negative comparators. Also, this circuitry and methodology is compatible with mainstream Electronic Design Automation (EDA) tools for synchronous digital design flows.

While the present disclosure has been particularly shown and described with Reference to the preferred embodiments thereof, it will be understood by those Skilled in the art that various changes in form and details may be made without Departing from the spirit and scope of the present disclosure.

What is claimed is:

1. A digital circuit for generating sub clock division and clock waves comprising:
   a combined positive and negative clock gate,
   a clock output generated by said combined positive and negative clock gate,
   a clock input coupled to a counter circuit and to said combined positive and negative clock gate,
   a positive comparator,
   a negative comparator,
   an output from said counter circuit coupled to said positive comparator and to said negative comparator,
   an enable positive clock signal in said combined positive and negative clock gate generated from an output from said positive comparator, and
   an enable negative clock signal in said combined positive and negative clock gate generated from an output from said negative comparator.

2. The digital circuit for generating sub clock division and clock waves of claim 1 wherein said combined positive and negative clock gate is comprised of:
   a positive clock gate containing an AND positive gate which ANDs said clock input and said enable positive signal, in order to edge-select said clock input rising edge,
   a negative clock gate containing an AND negative gate which ANDs the invert of said clock input and said enable negative signal, in order to edge-select said invert of said clock input rising clock edge, and
   an OR gate which ORs output from said AND positive gate, which is positive divided clock output and said AND negative gate, which is negative divided clock output.

3. The digital circuit for generating sub clock division and clock waves of claim 2 wherein said positive comparator's compare value is set equal to a number, 0, 1, 2, . . . (n−1), wherein the OR of said positive divided clock output and a zero from said negative divided clock output results in a divide by integer, 2, 3, 4, . . . , (n−1) clock output.

4. The digital circuit for generating sub clock division and clock waves of claim 2 wherein said negative comparator's compare value is set equal to a number, 0, 1, 2, . . . (n−1), wherein the OR of said negative divided clock output and a zero from said positive divided clock output results in a divide by integer, 2, 3, 4, . . . , (n−1) clock output.

5. The digital circuit for generating sub clock division and clock waves of claim 2 wherein said positive comparator's compare value is set equal to n−1, the maximum value of said counter circuit and wherein said negative comparator's compare value is set equal to (n−1)/2, wherein the OR of said positive divided clock output and said negative divided clock output results in a divide by n/2 clock output, where n is an odd number.

6. The digital circuit for generating sub clock division and clock waves of claim 2 wherein said negative comparator's compare value is set equal to n−1, the maximum value of said counter circuit and wherein said positive comparator's compare value is set equal to (n−1)/2, wherein the OR of said negative divided clock output and said positive divided clock output results in a divide by n/2 clock output, where n is an odd number.

7. The digital circuit for generating sub clock division and clock waves of claim 2 wherein said positive comparator's compare value is set equal to n−1, the maximum value of said counter circuit and wherein said negative comparator's compare value is set equal to some number less than (n−1), wherein the OR of said positive divided clock output and said negative divided clock output results in a two-pulse, pulse train whose period is n.

8. The digital circuit for generating sub clock division and clock waves of claim 2 wherein said negative comparator's compare value is set equal to n−1, the maximum value of said counter circuit and wherein said, positive comparator's compare value is set equal to some number less than (n−1), wherein the OR of said negative divided clock output and said positive divided clock output results in a two-pulse, pulse train whose period is n.

9. The digital circuit for generating sub clock division and clock waves of claim 1 wherein a counter phase offset block is placed in series between said counter circuit and said positive comparator and said negative comparator, wherein a programmable offset input couples to and controls said counter offset block.

10. The digital circuit for generating sub clock division and clock waves of claim 9 wherein said counter offset block can introduce phase shifts of any amount of degrees to said clock output.

11. The digital circuit for generating sub clock division and clock waves of claim 10 wherein said phase shifts are 0, 60, 90, 120, 180, 240, 270 or 300 degrees,
determined by a formula, (180/division factor)*N, where N varies from 0 to (2*division factor)−1,
wherein said phase shifts are 0, 90, 180, or 270 degrees for a division factor of 2, since said formula yields 180/2=90 times 0, 1, 2, or 3, and
wherein said phase shifts are 0, 60, 120, 180, 240, or 300 degrees for a division factor of 3, since said formula yields 180/3=60 times 0, 1, 2, 3, 4, or 5.

12. A method of providing a digital circuit for generating sub clock division and clock waves comprising the steps of:
providing a combined positive and negative clock gate,
generating a clock output by said combined positive and negative clock gate,
providing a clock input coupled to a counter circuit and to said combined positive and negative clock gate,
providing a positive comparator,
providing a negative comparator,
providing an output from said counter circuit coupled to said positive comparator and to said negative comparator,
providing an enable positive clock signal in said combined positive and negative clock gate generated from an output from said positive comparator, and
providing an enable negative clock signal in said combined positive and negative clock gate generated from an output from said negative comparator.

13. The method of providing a digital circuit for generating sub clock division and clock waves of claim 12 wherein said combined positive and negative clock gate is comprised of:
a positive clock gate containing an AND positive gate which ANDs said clock input and said enable positive signal, in order to edge-select said clock input rising edge,
a negative clock gate containing an AND negative gate which ANDs the invert of said clock input and said enable negative signal, in order to edge-select said invert of said clock input rising clock edge, and
an OR gate which ORs output from said AND positive gate, which is positive divided clock output and said AND negative gate, which is negative divided clock output.

14. The method of providing a digital circuit for generating sub clock division and clock waves of claim 13 wherein said positive comparator's compare value is set equal to a number, 0, 1, 2, . . . (n−1), wherein the OR of said positive divided clock output and a zero from said negative divided clock output results in a divide by integer, 2, 3, 4, . . . , (n−1) clock output.

15. The method of providing a digital circuit for generating sub clock division and clock waves of claim 13 wherein said negative comparator's compare value is set equal to a number, 0, 1, 2, . . . (n−1), wherein the OR of said negative divided clock output and a zero from said positive divided clock output results in a divide by integer, 2, 3, 4, . . . , (n−1) clock output.

16. The method of providing a digital circuit for generating sub clock division and clock waves of claim 13 wherein said positive comparator's compare value is set equal to n−1, the maximum value of said counter circuit and wherein said negative comparator's compare value is set equal to (n−1)/2, wherein the Or of said positive divided clock output and said negative divided clock output results in a divide by n/2 clock output, where n is an odd number.

17. The method of providing a digital circuit for generating sub clock division and clock waves of claim 13 wherein said negative comparator's compare value is set equal to n−1, the maximum value of said counter circuit and wherein said positive comparator's compare value is set equal to (n−1)/2, wherein the OR of said negative divided clock output and said positive divided clock output results in a divide by n/2 clock output, where n is an odd number.

18. The method of providing a digital circuit for generating sub clock division and clock waves of claim 13 wherein said positive comparator's compare value is set equal to n−1, the maximum value of said counter circuit and wherein said negative comparator's compare value is set equal to some number less than (n−1), wherein the OR of said positive divided clock output and said negative divided clock output results in a two-pulse, pulse train whose period is n.

19. The method of providing a digital circuit for generating sub clock division and clock waves of claim 13 wherein said negative comparator's compare value is set equal to n−1, the maximum value of said counter circuit and wherein said positive comparator's compare value is set equal to some number less than (n−1), wherein the OR of said negative divided clock output and said positive divided clock output results in a two-pulse, pulse train whose period is n.

20. The method of providing a digital circuit for generating sub clock division and clock waves of claim 12 wherein a counter phase offset block is placed in series between said counter circuit and said positive comparator and said negative comparator, wherein a programmable offset input couples to and controls said counter offset block.

22. The method of providing a digital circuit for generating sub clock division and clock waves of claim 20 wherein said counter offset block can introduce phase shifts of any amount of degrees to said clock output.

22. The method of providing a digital circuit for generating sub clock division and clock waves of claim 21 wherein said phase shifts are 0, 60, 90, 120, 180, 240, 270 or 300 degrees,
- determined by a formula, (180/division factor)*N, where N varies from 0 to (2*division factor)−1,
- wherein said phase shifts are 0, 90, 180, or 270 degrees for a division factor of 2, since said formula yields 180/2=90 times 0, 1, 2, or 3, and
- wherein said phase shifts are 0, 60, 120, 180, 240, or 300 degrees for a division factor of 3, since said formula yields 180/3=60 times 0, 1, 2, 3, 4, or 5.

* * * * *